United States Patent
Lu et al.

(10) Patent No.: US 7,507,604 B2
(45) Date of Patent: Mar. 24, 2009

(54) BREAKABLE INTERCONNECTS AND STRUCTURES FORMED THEREBY

(75) Inventors: Daoqiang Lu, Chandler, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/044,239

(22) Filed: Mar. 7, 2008

(65) Prior Publication Data

US 2008/0153207 A1 Jun. 26, 2008

Related U.S. Application Data

(62) Division of application No. 11/155,208, filed on Jun. 16, 2005.

(51) Int. Cl.
*H01L 21/50* (2006.01)
*H01L 21/48* (2006.01)
*H01L 23/52* (2006.01)
*H01L 23/48* (2006.01)

(52) U.S. Cl. .................. 438/119; 438/118; 438/106; 257/783; 257/780

(58) Field of Classification Search ............... 438/106, 438/118, 119; 257/780, 783
See application file for complete search history.

(56) References Cited

U.S. PATENT DOCUMENTS

| | | | | |
|---|---|---|---|---|
| 5,546,279 A * | 8/1996 | Aota et al. | ............ | 361/749 |
| 6,559,549 B1 * | 5/2003 | Cho | ............ | 257/797 |
| 6,620,652 B1 * | 9/2003 | Shibata | ............ | 438/119 |
| 6,777,464 B1 * | 8/2004 | Watanabe et al. | ............ | 523/457 |
| 6,833,180 B1 * | 12/2004 | Kodemura | ............ | 428/220 |
| 6,911,720 B2 * | 6/2005 | Yamazaki et al. | ............ | 257/678 |
| 6,926,796 B1 * | 8/2005 | Nishida et al. | ............ | 156/312 |

* cited by examiner

*Primary Examiner*—Luan C Thai
(74) *Attorney, Agent, or Firm*—Kathy J. Ortiz

(57) ABSTRACT

Methods of forming a microelectronic structure are described. Embodiments of those methods include placing an anisotropic conductive layer comprising at least one compliant conductive sphere on at least one interconnect structure disposed on a first substrate, applying pressure to contact the compliant conductive spheres to the at least one interconnect structure, removing a portion of the anisotropic conductive layer to expose at least one of the compliant conductive spheres; and then attaching a second substrate to the anisotropic conductive layer.

11 Claims, 6 Drawing Sheets

BREAKABLE INTERCONNECTS AND STRUCTURES FORMED THEREBY

CROSS-REFERENCE TO RELATED APPLICATIONS

This application is a Divisional application of Ser. No. 11/155,208 filed Jun. 16, 2005, entitled "BREAKABLE INTERCONNECTS AND STRUCTURES FORMED THEREBY".

BACKGROUND OF THE INVENTION

System performance may be improved by increasing the quality of I/O (input/output) signals transmitted between an integrated circuit die and associated receivers and/or between die on adjacent substrates. In some instances, such I/O interconnects may require breakable connections at various locations between the die and substrates, for example. Conductive films may be used to provide such breakable connections.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
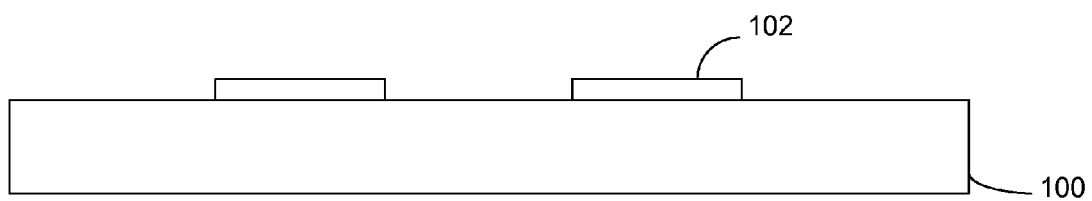
FIGS. 1a-1h represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a breakable interconnect structure, are described. Those methods may comprise placing an anisotropic conductive layer comprising at least one compliant conductive sphere on at least one interconnect structure disposed on a first substrate, applying pressure to contact the at least one compliant conductive sphere to the at least one interconnect structure, removing a portion of the anisotropic conductive layer to expose at least one of the compliant conductive spheres; and then attaching a second substrate to the anisotropic conductive layer.

FIGS. 1a-1h illustrate an embodiment of a method of forming a microelectronic structure, such as a breakable interconnect structure, for example. FIG. 1a illustrates a first substrate 100. In one embodiment, the first substrate 100 may comprise at least one of a power delivery substrate, an interposer, a motherboard, a package, a flexible circuit, and may be any portion of a microelectronic device that may be coupled and/or contacted to another portion of a microelectronic device, for example.

The substrate 100 may comprise at least one interconnect structure 102, that may serve to electrically connect the first substrate 100 to other structures within a microelectronic device, for example. The at least one interconnect structure 102 may comprise any conductive material, such as but not limited to copper, aluminum, gold, silver and/or nickel and combinations thereof, and in some embodiments may comprise a metal pad or solder balls, for example.

Figure 1B:
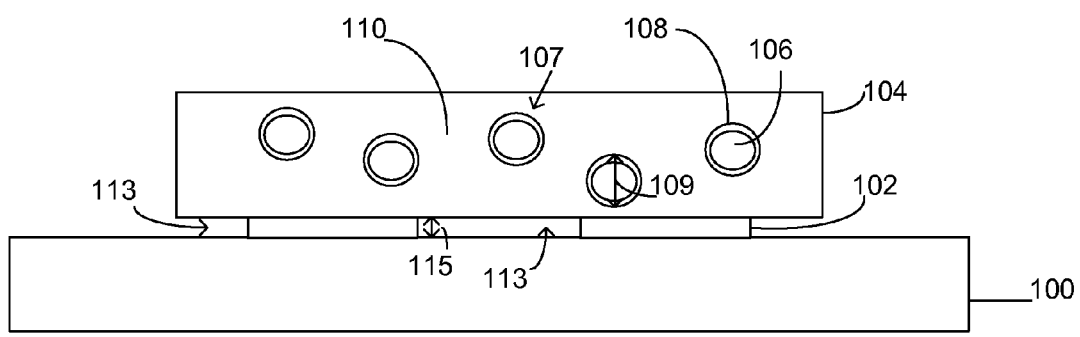

In one embodiment, an anisotropic conductive layer 104 may be formed and/or placed on the first substrate 100 utilizing any well known method of placement and/or formation, such as but not limited to laminating the anisotropic conductive layer 104 onto the substrate 100, for example (FIG. 1b). In one embodiment, the anisotropic conductive layer 104 may comprise any layer that may conduct in the thickness direction of the layer (perpendicular to the substrate 100 in this embodiment), as is well known in the art.

In one embodiment, the anisotropic conductive layer 104 may comprise a polymer matrix 110 and at least one compliant conductive sphere 107. In one embodiment, the polymer matrix 110 may comprise at least one of polyurethane, polystyrene copolymer, polyolefins, silicone, polyurethane, epoxy silicone and combinations thereof. In one embodiment, the polymer matrix 110 may comprise monomers and/or a thermoplastic polymer, as are well known in the art.

In one embodiment, the at least one compliant conductive sphere 107 may comprise a matrix 106 and a coating 108. In one embodiment, the matrix 106 may comprise at least one of epoxy, silicone, polyurethane and combinations thereof. In some embodiments the matrix 106 may provide the at least one compliant conductive sphere 107 with flexibility and compliance. In one embodiment, the coating 108 may comprise a conductive material, such as but not limited to nickel, gold, platinum and paladium and combinations thereof. In one embodiment, the at least one compliant conductive sphere 107 may comprise a diameter 109 of between about 10 to about 300 microns.

In one embodiment, the anisotropic conductive layer 104 may be compressed between two interconnect structures, and may be trapped and make intimate contact between both of the interconnect structures, and thus the two interconnect structures may become electrically connected through the conductive spheres 107 of the anisotropic conductive layer 104. However, due to the low volume loading of the compliant conductive spheres 107, the compliant conductive spheres 107 will rarely if ever contact each other and thus may not provide significant electrical connection laterally.

Figure 1C:
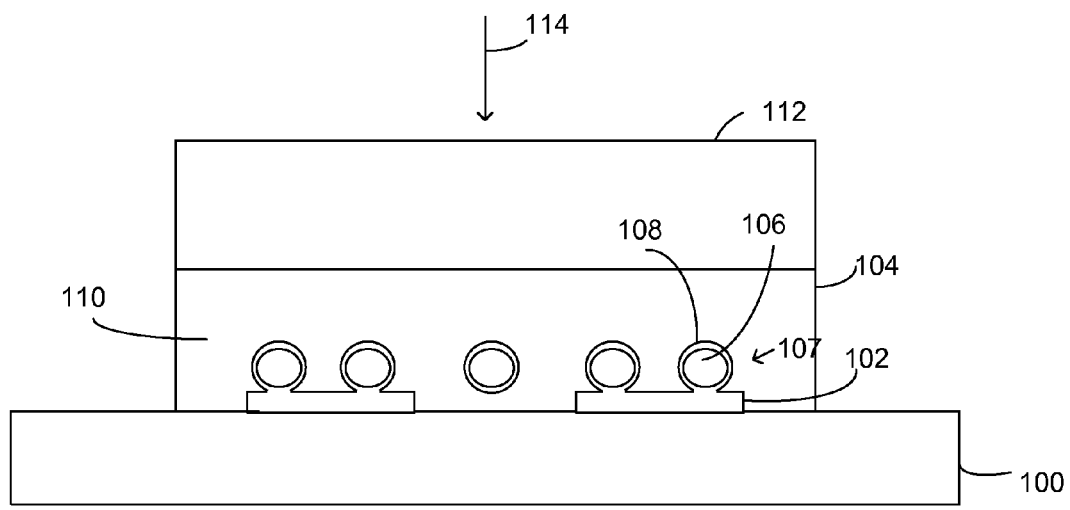

A chuck 112 that in some embodiments may be pre-heated and comprise a non-sticking surface, may be pressed down by applying sufficient pressure 114 onto the anisotropic conductive layer 104 (FIG. 1c). The amount of pressure 114 and heat applied will depend upon the particular application, but the pressure 114 applied may be sufficient enough to cause the at least one compliant conductive sphere 107 to make contact with the at least one interconnect structure 102 of the first substrate 100. In one embodiment, the at least one conductive sphere 107 may be electrically coupled to the at least one interconnect structure 102.

In one embodiment, the amount of heat applied to the anisotropic conductive layer 104 may be sufficient to substantially soften and/or melt the anisotropic conductive layer 104. In one embodiment, the anisotropic conductive layer 104 may soften and/or melt such that the anisotropic conductive layer 104 may fill in a region 113 between the anisotropic conductive layer 104 and the first substrate 100 that may be separated by a height 115 of the at least one interconnect structure 102 (refer back to FIG. 1b).

In one embodiment, when the anisotropic conductive layer 104 may comprise monomers, the anisotropic conductive layer 104 may be solidified by thermal curing. In one embodiment, the anisotropic conductive layer 104 may be thermally cured by utilizing the heat that may be supplied by the chuck 112. In one embodiment, when the anisotropic conductive layer 104 may comprise a thermoplastic polymer, the anisotropic conductive layer 104 may be solidified by cooling. In one embodiment, the anisotropic conductive layer 104 may be bonded to the first substrate 100 by cooling and/or thermal curing. In one embodiment, the anisotropic conductive layer 104 may maintain compliance and flexibility due to the compliant nature of the polymeric matrix 110 as well as the compliant nature of the matrix 106 of the at least one compliant conductive sphere 107.

Figure 1D:
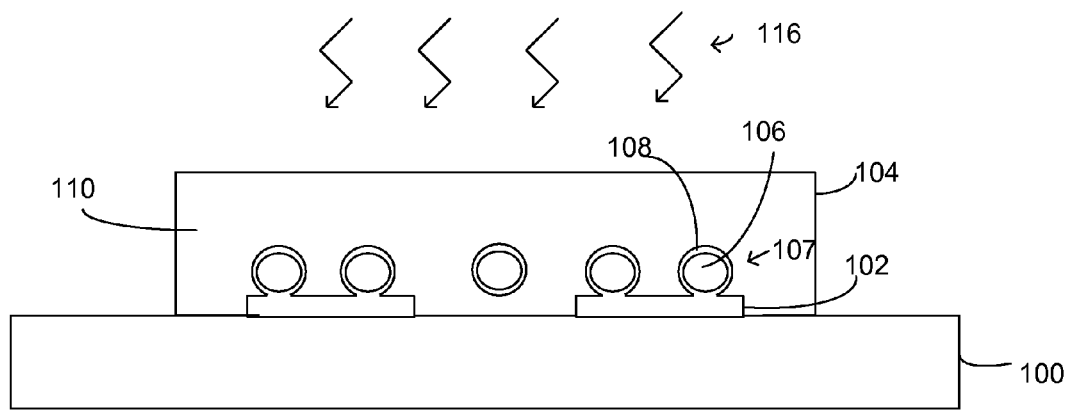
Figure 1E:
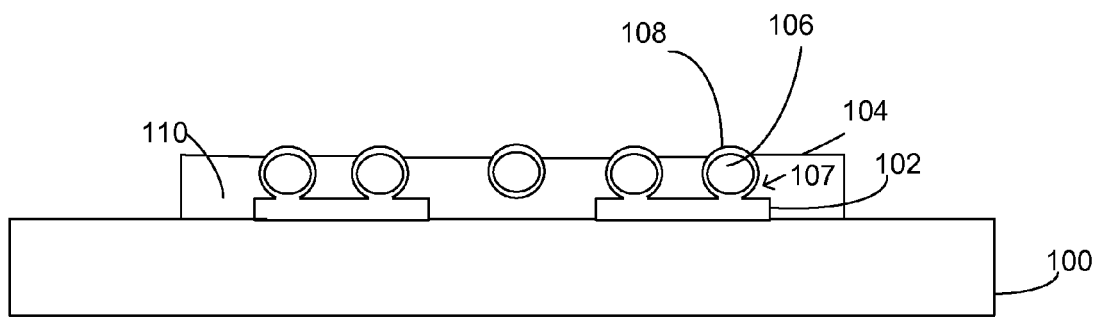

Once the anisotropic conductive layer 104 has solidified the chuck 112 may be released (FIG. 1d). In one embodiment, a portion of the anisotropic conductive layer 104 may be removed to expose a portion of the at least one compliant conductive spheres 107 (FIG. 1e). In one embodiment, a portion of the polymer matrix 110 of the anisotropic conductive layer 104 may be removed by utilizing a plasma etch process 116 (FIG. 1d), as is well known in the art. In one embodiment, the coating 108 of at least one of the compliant conductive spheres 107 may be exposed (FIG. 1e).

Figure 1F:
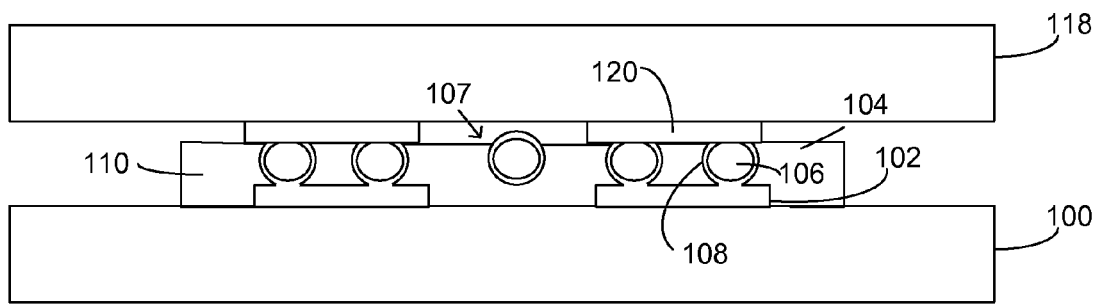

In one embodiment, a second substrate 118 may be attached and disposed on the anisotropic conductive layer 104, such that at least one interconnect structure 120 that may be disposed on the second substrate 118 may be coupled with and/or disposed on an exposed one of the at least one compliant conductive sphere 107 (FIG. 1f). In one embodiment, the second substrate 118 may comprise at least one of a power delivery substrate, an interposer, a motherboard, a package, a flexible circuit, and may be any portion of a microelectronic device that may be coupled and/or contacted to another portion of a microelectronic device, for example. In one embodiment, the at least one interconnect structure 120 may comprise any conductive material, and in some embodiments may comprise a metal pad or solder balls, for example.

Figure 1G:
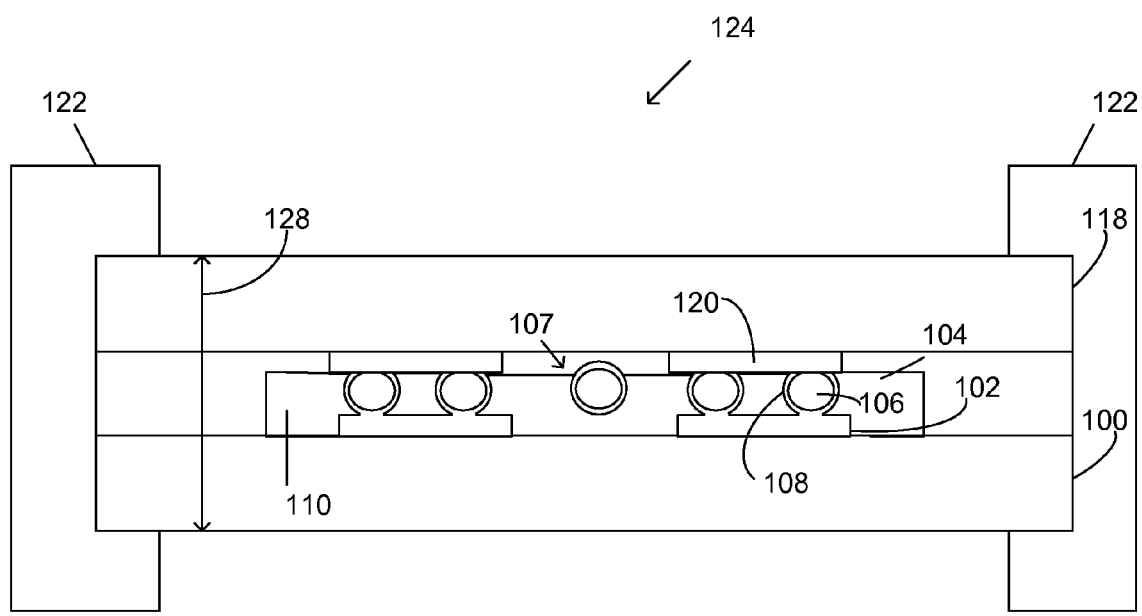
Figure 1H:
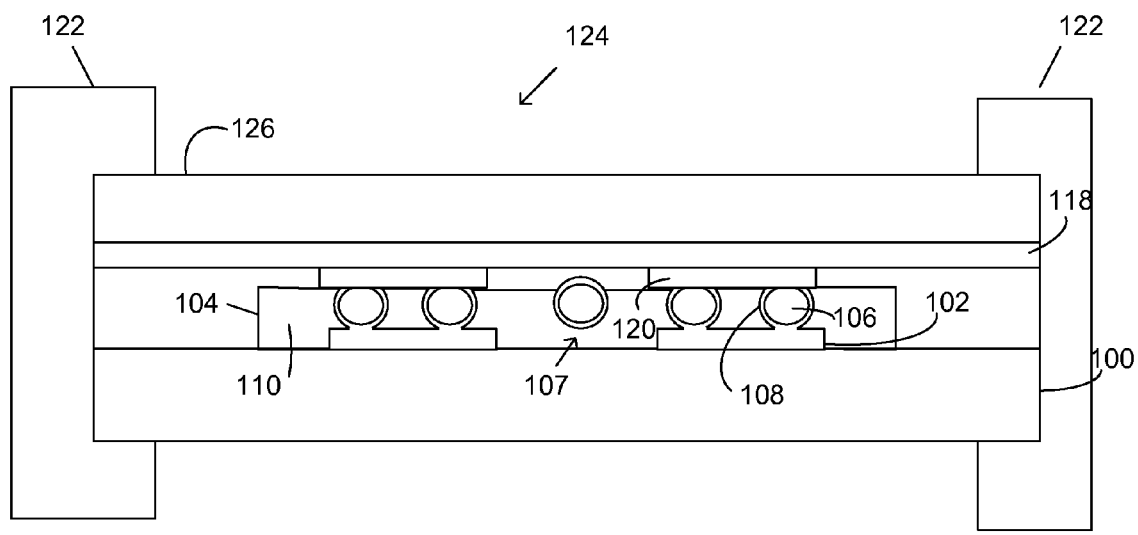

In one embodiment, the first substrate 100 and the second substrate 118 may be clamped together by the utilization of a clamping structure 122 (FIG. 1g). By mechanically clamping the first and the second substrates 100, 118 together, the first and the second substrates 100, 118 may be electrically connected and/or coupled together through the at least one compliant conductive sphere 107. In this manner, a breakable interconnect structure 124 may be formed, wherein the interconnection and/or coupling between the first and the second substrates 100, 118 may be broken depending upon the particular application requirements. In one embodiment, the interconnection between the first and the second substrates 100, 118 may be broken by removing the clamping structure 122. Clamping structure 122 may be part of a socket or a connector retention structure, as are well known in the art.

Due to the compliance of the at least one compliant conductive sphere 107 and the polymer matrix 110, reliable contact between the first and the second substrates 100, 118 may be made, wherein the breakable interconnect structure 124 may exhibit small to negligible electrical parasitic characteristics. The breakable interconnect structure 124 may also exhibit a small profile height 128 that may greatly enhance performance while operating at high speeds, for example. Additionally, the breakable interconnect structure 124 may be manufactured in a high volume environment, and may be extremely economical since the anisotropic conductive layer 104 may be commercially available at a relatively low cost.

In another embodiment, the second substrate 118 of the breakable interconnect structure 124 may comprise a flexible input/output signal routing substrate (FIG. 1h), such as a high speed flexible circuit as is well known in the art. In one embodiment, the flexible substrate may include a support structure 126, such as a stiffener, for example, that may provide mechanical support for the flexible circuit, and may in some embodiments enhance the reliability of the connection between the first and the second substrates 100, 118.

Figure 2:
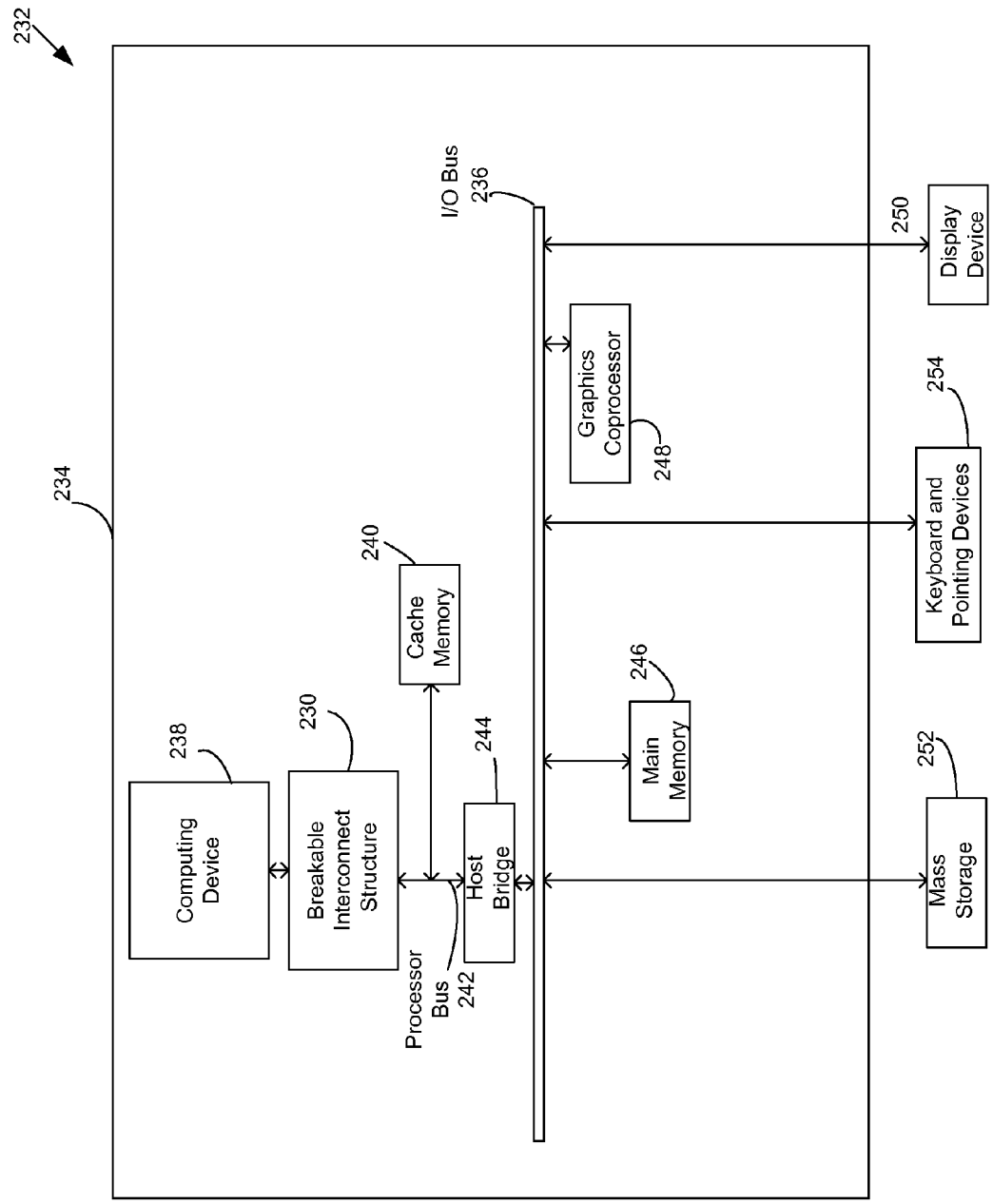
FIG. 2 represents a system according to another embodiment of the present invention.

FIG. 2 is a diagram illustrating an exemplary system 232 capable of being operated with methods for fabricating a microelectronic structure, such as the breakable interconnect structure 124 of FIG. 1g for example. It will be understood that the present embodiment is but one of many possible systems in which the breakable interconnect structures of the present invention may be used.

In the system 232 a breakable interconnect structure 230 may be communicatively coupled to a computing device 238, such as a processor, and a cache memory 240 may be communicatively coupled to the breakable interconnect structure 230 through a processor bus 242, for example. The processor bus 242 and an I/O bus 236 may be bridged by a host bridge 244. Communicatively coupled to the I/O bus 236 and also to the breakable interconnect structure 230 may be a main memory 246. Examples of the main memory 246 may include, but are not limited to, static random access memory (SRAM) and/or dynamic random access memory (DRAM), and/or some other state preserving media. The system 232 may also include a graphics coprocessor 248, however incorporation of the graphics coprocessor 248 into the system 232 is not necessary to the operation of the system 232. Coupled to the I/O bus 236 may also, for example, be a display device 250, a mass storage device 252, and keyboard and pointing devices 254.

Alternatively, the breakable interconnect structure 230 may be communicatively coupled (not shown) to a printed circuit board (PCB) 234 by way of the I/O bus 236. The communicative coupling of the breakable interconnect structure 230 may be established by physical means, such as through the use of a package and/or a socket connection to mount the breakable interconnect structure 230 to the PCB 234 (for example by the use of a chip package, interposer and/or a land grid array socket). The breakable interconnect structure 230 may also be communicatively coupled to the PCB 234 through various wireless means (for example, without the use of a physical connection to the PCB), as are well known in the art.

These elements perform their conventional functions well known in the art. In particular, mass storage 252 may be used to provide long-term storage for executable instructions for a method for forming breakable interconnect structures in accordance with embodiments of the present invention, whereas main memory 246 may be used to store on a shorter term basis the executable instructions of a method for forming breakable interconnect structures in accordance with embodiments of the present invention during execution by computing device 238. In addition, the instructions may be stored, or otherwise associated with, machine accessible media communicatively coupled with the system, such as compact disk read only memories (CD-ROMs), digital versatile disks (DVDs), and floppy disks, carrier waves, and/or other propagated signals, for example. In one embodiment, main memory 246 may supply the computing device 238 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures are well known in the art. Therefore, the Figures provided herein illustrate only portions of an exemplary microelectronic structure that pertains to the practice of the present invention. Thus the present invention is not limited to the structures described herein.

What is claimed is:

1. A method comprising;
    placing an anisotropic conductive layer comprising at least one compliant conductive sphere on at least one interconnect structure disposed on a first substrate;
    applying pressure to contact the at least one compliant conductive sphere to the at least one interconnect structure;
    removing a portion of the anisotropic conductive layer to expose at least one of the compliant conductive spheres; and
    attaching a second substrate to the anisotropic conductive layer.

2. The method of claim 1 wherein applying pressure to contact the at least one compliant conductive sphere to the at least one interconnect structure further comprises applying heat to melt the anisotropic conductive layer.

3. The method of claim 2 further comprising solidifying the anisotropic conductive layer by at least one of thermal cooling and curing.

4. The method of claim 1 wherein the at least one compliant conductive sphere comprises a coating selected from the group consisting of nickel, gold, platinum and paladium and combinations thereof.

5. The method of claim 1 wherein the at least one compliant conductive sphere comprises a matrix comprising at least one of epoxy, silicone, polyurethane and combinations thereof.

6. The method of claim 1 wherein the anisotropic conductive layer comprises the at least one compliant conductive sphere dispersed within a polymeric matrix.

7. The method of claim 6 wherein the polymeric matrix comprises at least one of polyurethane, polystyrene copolymer, and polyolefins, silicone, polyurethane, epoxy silicone and combinations thereof.

8. The method of claim 1 wherein attaching a second substrate to the anisotropic conductive layer comprises contacting at least one interconnect structure disposed on the second substrate to at least one of the exposed compliant conductive spheres.

9. The method of claim 1 further comprising attaching a clamp structure on the first substrate and the second substrate that is capable of applying pressure to clamp the first substrate and the second substrate together.

10. The method of claim 9 wherein the clamp structure is capable of providing a breakable interconnection between the first substrate and the second substrate.

11. The method of claim 1 wherein at least one of the first substrate and the second substrate comprises a flexible circuit.

* * * * *